United States Patent
Chou

(10) Patent No.: US 9,728,479 B2
(45) Date of Patent: Aug. 8, 2017

(54) MULTI-CHIP PACKAGE STRUCTURE, WAFER LEVEL CHIP PACKAGE STRUCTURE AND MANUFACTURING PROCESS THEREOF

(71) Applicants: ChipMOS Technologies Inc., Hsinchu (TW); ChipMOS Technologies (Bermuda) Ltd., Hamilton (BM)

(72) Inventor: Shih-Wen Chou, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 14/856,546

(22) Filed: Sep. 16, 2015

(65) Prior Publication Data
US 2016/0315028 A1   Oct. 27, 2016

(30) Foreign Application Priority Data
Apr. 27, 2015   (TW) .............................. 104113402 A

(51) Int. Cl.
*H01L 23/31*   (2006.01)
*H01L 25/00*   (2006.01)
(Continued)

(52) U.S. Cl.
CPC ........ *H01L 23/3157* (2013.01); *H01L 21/563* (2013.01); *H01L 24/94* (2013.01); *H01L 24/97* (2013.01); *H01L 25/0657* (2013.01); *H01L 25/50* (2013.01); *H01L 21/561* (2013.01); *H01L 2224/0401* (2013.01); *H01L 2224/06135* (2013.01); *H01L 2224/1403* (2013.01); *H01L 2224/16147* (2013.01); *H01L 2224/16227* (2013.01); *H01L 2224/1703* (2013.01); *H01L 2224/26145* (2013.01);
(Continued)

(58) Field of Classification Search
CPC ........ H01L 23/31; H01L 25/065; H01L 25/00
See application file for complete search history.

(56) References Cited

U.S. PATENT DOCUMENTS 6,291,264 B1 *   9/2001   Tang ..................... H01L 21/563
                                            257/E21.503
7,218,005 B2 *   5/2007   Tago ................... H01L 23/3114
                                            257/777
(Continued)

FOREIGN PATENT DOCUMENTS

TW   I313048   8/2009

*Primary Examiner* — Peniel M Gumedzoe
(74) *Attorney, Agent, or Firm* — Jianq Chyun IP Office

(57) ABSTRACT

A multi-chip package structure includes a first chip, a second chip, a circuit layer, a plurality of first conductive bumps, a plurality of second conductive bumps and an underfill. The first chip has a chip bonding region, a plurality of first inner pads and first outer pads. The circuit layer is disposed on the first chip and includes a plurality of insulating layers and at least one metal layer. The insulating layers have a groove disposed between the first inner pads and the first outer pads and surrounding the first inner pads. The first conductive bumps are disposed on the first outer pads. The second chip is flipped on the chip bonding region. Each first inner pad is electrically connected to a second pad of the second chip through the second conductive bump. The underfill is disposed between the first and second chips and covers the second conductive bumps.

10 Claims, 9 Drawing Sheets

(51) Int. Cl.
    *H01L 21/56*       (2006.01)
    *H01L 25/065*    (2006.01)
    *H01L 23/00*       (2006.01)

(52) U.S. Cl.
    CPC ............ *H01L 2224/32145* (2013.01); *H01L 2224/73204* (2013.01); *H01L 2224/83385* (2013.01); *H01L 2224/94* (2013.01); *H01L 2224/97* (2013.01); *H01L 2225/06513* (2013.01); *H01L 2225/06517* (2013.01); *H01L 2225/06568* (2013.01)

(56) References Cited

U.S. PATENT DOCUMENTS

| | | | |
|---|---|---|---|
| 2005/0195582 A1* | 9/2005 | Landeros | B23K 1/0016 361/760 |
| 2006/0046352 A1 | 3/2006 | Low et al. | |
| 2006/0226527 A1 | 10/2006 | Hatano et al. | |
| 2010/0072626 A1* | 3/2010 | Theuss | B81C 1/00301 257/774 |
| 2014/0353823 A1* | 12/2014 | Park | H01L 23/3128 257/737 |
| 2015/0179614 A1* | 6/2015 | Murai | H01L 25/0657 257/784 |

* cited by examiner

MULTI-CHIP PACKAGE STRUCTURE, WAFER LEVEL CHIP PACKAGE STRUCTURE AND MANUFACTURING PROCESS THEREOF

CROSS-REFERENCE TO RELATED APPLICATION

This application claims the priority benefit of Taiwan application serial no. 104113402, filed on Apr. 27, 2015. The entirety of the above-mentioned patent application is hereby incorporated by reference herein and made a part of this specification.

BACKGROUND OF THE INVENTION

1. Field of the Invention

The invention generally relates to a package structure and a manufacturing process, and more particularly, to a multi-chip package structure, a wafer level chip package structure and a manufacturing process thereof.

2. Description of Related Art

The integrated circuit chips (IC chips) are required to more offer powerful functions as electronic products develop toward high functionality, high-speed signal transmission and high density of circuit elements. Moreover, more passive devices are demanded for consumer electronic products. However, under the developing trends of electronic products for miniaturization, lightweight, and low cost, the IC packaging industry is concerned about how to accommodate numerous electronic components or devices in the limited packaging space. In order to meet the above requests, packaging technology gradually moves towards a system integration phase of system in package (SIP), and more particularly to the packaging of multi-chip module (MCM).

Using a multi-chip package structure an example, it is mainly to dispose a first chip on a second chip by a face-to-face method, and then to use a conductive bump as an electrically connection media between the chips, wherein the second chip will be electrically connected with a circuit board by means of using a bump or wire bonding.

In such package structure, since the space on the chips increasingly narrows, when a size of the first chip is close to that of the second chip, an edge of the first chip will be very close to the conductive bump, which is configured to connect to the circuit board, on the second chip. Therefore, when filling an underfill in-between the first chip and the second chip, the underfill can easily overflow to a solder pad of the conductive bump, which is configured to connect to the circuit board, on the second chip, and thereby influence the electrical connection reliability between the second chip and the circuit board.

SUMMARY OF THE INVENTION

The invention is directed to a multi-chip package structure having a groove capable of preventing an underfill overflow.

The invention is directed to a wafer level chip package structure, which can cut out a plurality of said multi-chip package structures.

The invention is directed to a wafer level chip package manufacturing process structure, which is capable of producing said wafer level chip package structure.

A multi-chip package structure of the invention includes a first chip, a circuit layer, a plurality of first conductive bumps, a second chip, a plurality of second conductive bumps, and an underfill. The first chip has a chip bonding region, a plurality of first inner pads locate in the chip bonding region and a plurality of first outer pads located outside of the chip bonding region. The circuit layer is disposed on the first chip, and the circuit layer includes a plurality of insulating layers and at least one metal layer disposed between the insulating layers. The insulating layers have at least one groove, the groove is disposed between the first inner pads and the first outer pads, and the groove surrounds the first inner pads. The first conductive bumps are disposed on the first outer pads. The second chip is flipped on the chip bonding region, and the second chip has a plurality of second pads. The second conductive bumps are located between the first inner pads and the second pads, and each of the first inner pads is electrically connected with the corresponding second pad through the corresponding second conductive bump. The underfill is located between the first chip and the second chip so as to cover the second conductive bumps.

A wafer level chip package manufacturing process of the invention includes the following steps. A wafer is provided, and the wafer includes a plurality of first chips arranged in an array and a circuit layer disposed on the first chips, wherein each of the first chips has a chip bonding region, a plurality of first inner pads located in the chip bonding region and a plurality of first outer pads located outside the chip bonding region, the circuit layer includes a plurality of insulating layers and at least one metal layer disposed between the insulating layers, the insulating layers have at least one groove, the groove is disposed between the first inner pads and the first outer pads, and the groove surrounds the first inner pads. A plurality of first conductive bumps is formed on the first outer pads. A plurality of second chips is provided, each of the second chips has a plurality of second pads, and the second pads are formed with a plurality of second conductive bumps thereon. The second chips are flipped on the chip bonding regions, so that the second conductive bumps are located between the first inner pads and the second pads, and each of the first inner pads is electrically connected with the corresponding second pad through the corresponding second conductive bump. An underfill is formed between the first chips and the second chips so as to cover the second conductive bumps.

A wafer level chip package structure of the invention includes a wafer, a plurality of first conductive bumps, a plurality of second chips, a plurality of second conductive bumps, and an underfill. The wafer includes a plurality of first chips arranged in an array and a circuit layer disposed on the first chips, wherein each of the first chips has a chip bonding region, a plurality of first inner pads located in the chip bonding region and a plurality of first outer pads located outside of the chip bonding region, the circuit layer includes a plurality of insulating layers and at least one redistribution circuit layer disposed between the insulating layers, the insulating layers have a plurality of grooves located, the grooves are disposed between the first inner pads and the first outer pads, and the grooves surround the first inner pads. The first conductive bumps are disposed on the first outer pads. The second chips are flipped on the chip bonding regions, and each of the second chips has a plurality of second pads. The second conductive bumps are located between the first inner pads and the second pads, and each of the first inner pads is electrically connected with the corresponding second pad through the corresponding second conductive bump. The underfill is located between the first chips and the second chips, so as to cover the second conductive bumps.

In view of the above, when experiencing an underfill overflow, the multi-chip package structure of the invention prevents the excess underfill between the first chip and the second chip from contacting with the first conductive bumps and influencing an electrical connectivity between the first conductive bumps and the circuit board by forming at least one groove in the insulating layers and enabling the excess underfill to flow into the groove, wherein the groove is disposed between the first inner pads and the first outer pads and surrounds the first inner pads. The invention may further provide the wafer level chip package structure, which can cut out a plurality of said multi-chip package structures, and the manufacturing process thereof.

In order to make the aforementioned features and advantages of the present invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
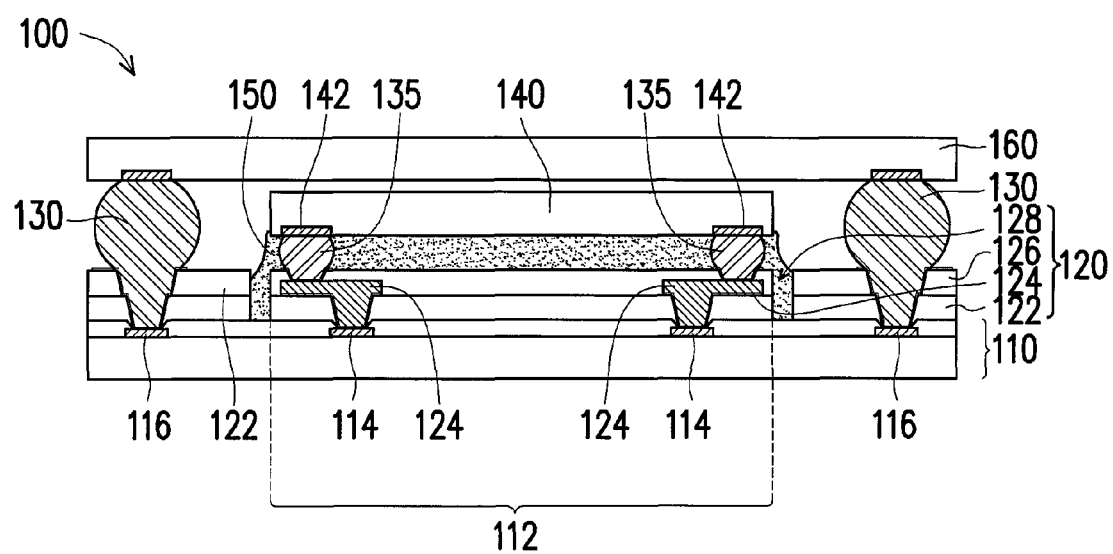
FIG. 1 is a schematic view illustrating a multi-chip package structure according to an embodiment of the invention.

FIG. 1 is a schematic view illustrating a multi-chip package structure according to an embodiment of the invention. Referring to FIG. 1, a multi-chip package structure 100 of the present embodiment includes a first chip 110, a circuit layer 120, a plurality of first conductive bumps 130, a plurality of second conductive bumps 135, a second chip 140, an underfill 150, and a circuit board 160.

The first chip 110 has a chip bonding region 112, a plurality of first inner pads 114 located in the chip bonding region 112 and a plurality of first outer pads 116 located outside of the chip bonding region 112.

The circuit layer 120 is disposed on the first chip 110, and the circuit layer 120 includes a plurality of insulating layers 122 and 126 and at least one metal layer 124 disposed between the insulating layers 122 and 126. In detail, the insulating layers of the circuit layer 120 includes a first insulating layer 122 and a second insulating layer 126. The first insulating layer 122 is disposed on the first chip 110 and exposes the first inner pads 114 and the first outer pads 116. The metal layer 124 is disposed on the first insulating layer 122 and electrically connected with the first inner pads 114. The second insulating layer 126 covers on the first insulating layer 122 and the metal layer 124 so as to expose a portion of the metal layer 124 and the first outer pads 116. In the present embodiment, the metal layer 124 may extend outwards to form a redistribution circuit layer (RDL), so as to be disposed on the first insulating layer 122 and electrically connected with the first inner pads 114. In other embodiments, the metal layer 124 may also be columnar metal layers corresponded to the first inner pads 114.

In the present embodiment, a size of the first chip 110 is greater than a size of the second chip 140, and the second chip 140 of smaller size is flipped on the chip bonding region 112 of the first chip 110 of larger size. The second chip 140 has a plurality of second pads 142. The second conductive bumps 135 are located between the first inner pads 114 of the first chip 110 and the second pads 142 of the second chip 140. The first inner pads 114 of the first chip 110 are electrically connected with the corresponding second pads 142 on the second chip 140 through the metal layer 124 and the corresponding second conductive bumps 135, so that the first chip 110 is electrically connected with the second chip 140.

The underfill 150 is located between the first chip 110 and the second chip 140, so as to cover the second conductive bumps 135. A material of the underfill 150 is, for example, epoxy, and the underfill 150 can be used to provide a fixing effect between the first chip 110 and the second chip 140, and can further provide cushion, moisture-proof and dust-proof effects for enhancing a reliability of the multi-chip package structure 100.

The first conductive bumps 130 are disposed on the first outer pads 116 of the first chip 110, and the first chip 110 can be electrically connected with a circuit board 160 through the first conductive bumps 130. In the present embodiment, since the second chip 140 and the second conductive bumps 135 are located between the circuit board 160 and the first chip 110, a height of the first conductive bumps 130 is greater than a height of the second conductive bumps 135. Furthermore, the height of the first conductive bumps 130 is greater than a total height of the second conductive bumps 135 and the second chip 140.

When manufacturing the multi-chip package structure 100 of the present embodiment, the second chip 140 is firstly being flipped and electrically connected onto the first chip 110, the underfill 150 is next being filled in-between the first chip 110 and the second chip 140, and the first chip 110 is then connected to the circuit board 160 through the first conductive bumps 130, so as to enable the first chip 110, the second chip 140 and circuit board 160 to be electrically connected with each other. As shown in FIG. 1, since the size of the first chip 110 is close to the size of the second chip 140, when the underfill 150 is filled into a portion between the first chip 110 and the second chip 140, there is a possibility that the underfill 150 may overflow to contact the first conductive bumps 130.

In order to prevent the first conductive bumps 130 from being conglutinated by the underfill 150 and later influencing a connectivity with the circuit board 160, in the present embodiment, the first insulating layer 122 and the second insulating layer 126 have at least one groove 128, the groove 128 is disposed between the first inner pads 114 and the first outer pads 116, and the groove 128 surrounds the first inner pads 114. Furthermore, in the present embodiment, the multi-chip package structure 100 prevents the excess underfill 150 from contacting with the first conductive bumps 130 during an overflow by forming the groove 128 in the first insulating layer 122 and the second insulating layer 126 so as to fill the excess portion of the underfill 150 into the groove 128.

It is to be explained that, in the present embodiment, a depth of the groove 128 is equal to a total thickness of the first insulating layer 122 and the second insulating layer 126, but in other embodiments, the depth of the groove 128 may also be less than the total thickness of the first insulating layer 122 and the second insulating layer 126.

Figure 2A:
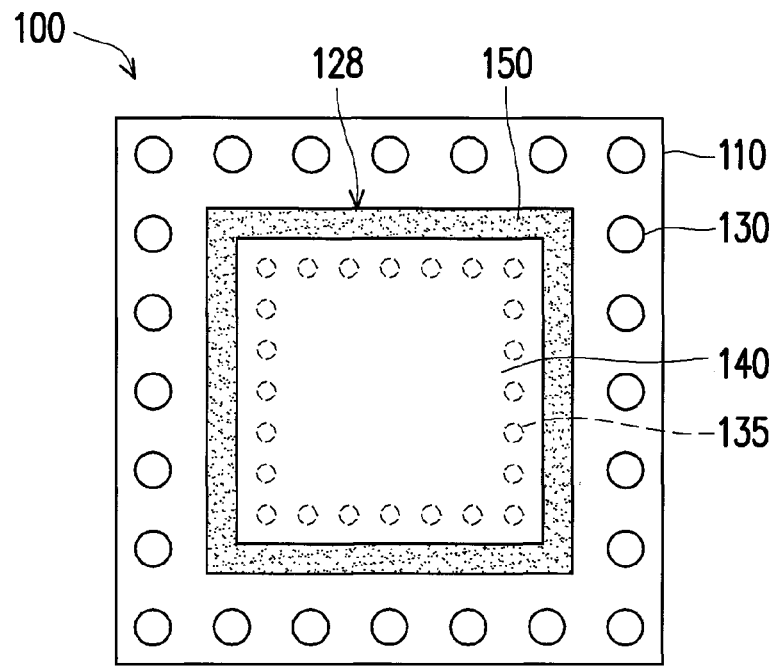
FIG. 2A is a top schematic view illustrating a circuit board that hides the multi-chip package structure of FIG. 1.

FIG. 2A is a top schematic view illustrating a circuit board that hides the multi-chip package structure of FIG. 1. As shown in FIG. 1 and FIG. 2A, in the present embodiment, the groove 128 is an annular groove, and a location of the groove 128 in the first insulating layer 122 and the second insulating layer 126 is corresponded to an outer profile of the second chip 140, and the groove 128 surrounds the second conductive bumps 135. When the underfill 150 is filled in-between the first chip 110 and the second chip 140 to surround the second conductive bumps 135, the excess underfill 150 is filled into the groove 128, thereby effectively reducing the chance for the underfill 150 to overflow to the first conductive bumps 130. Therefore, the first conductive bumps 130 would not be contaminated by the underfill 150, thereby influencing the connectivity with the circuit board 160 thereof.

Figure 2B:
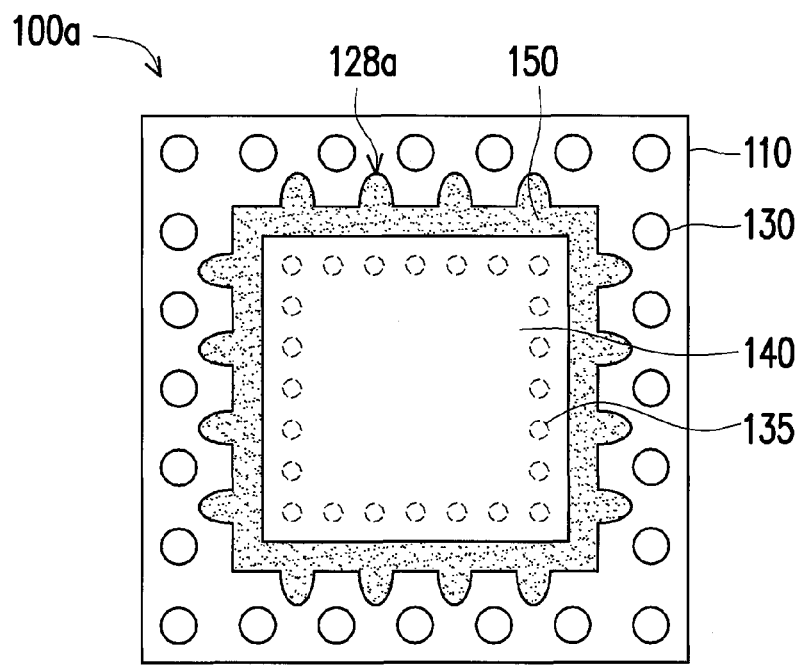
FIG. 2B to FIG. 2D are top schematic views each illustrating a hidden circuit board of a multi-chip package structure according to other embodiments of the invention.
Figure 2C:
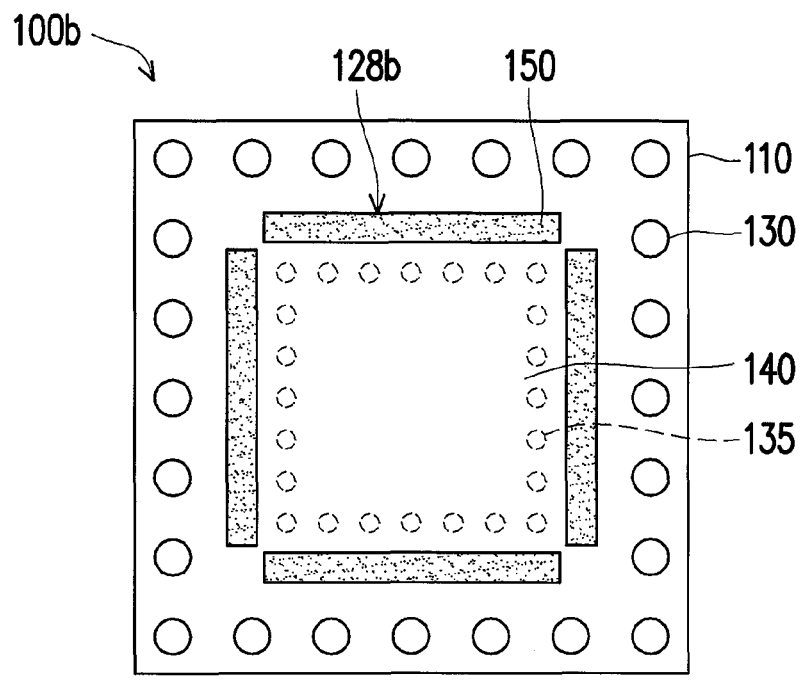
Figure 2D:
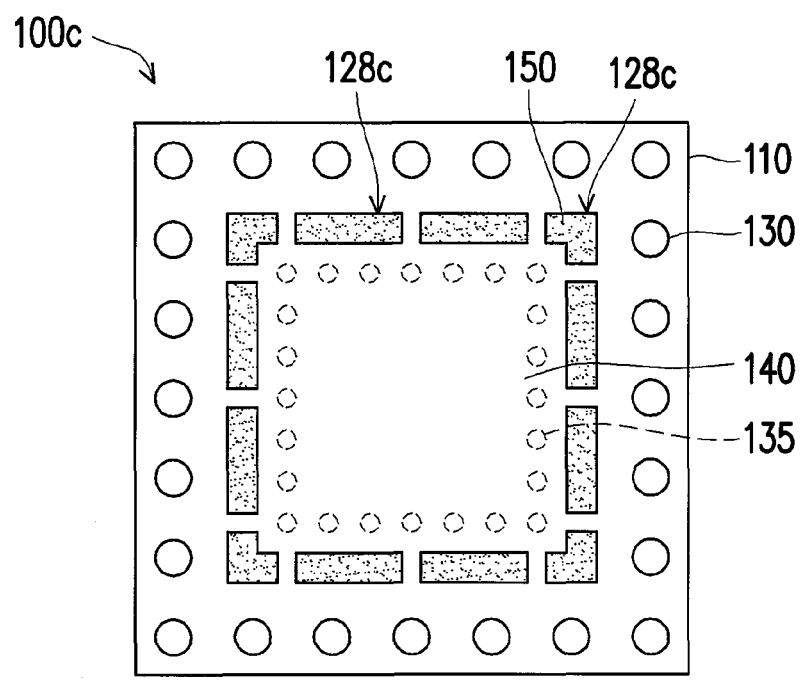

It is to be explained that, only one form of the groove 128 is shown in the above, but the shape and profile of the groove 128 are not limited thereto. FIG. 2B to FIG. 2D are top schematic views each illustrating a hidden circuit board of a multi-chip package structure according to other embodiments of the invention. In order to facilitate understanding, in FIG. 2B to FIG. 2D, similar or identical elements are represented by same reference numerals as that of the elements in the previous embodiment. Referring to FIG. 2B, groove 128a is also an annular groove. A difference between the groove 128a of the multi-chip package structure 100a of the present embodiment and the groove 128 of the previous embodiment mainly lies in that, in the present embodiment, partial region of the groove 128a sinks towards a space between the first conductive bumps 130, thereby causing an outer profile of the groove 128a to appear as a profile staggered with straight lines and arcs, and relatively, causing an increase in the space for accommodating the underfill.

Referring to FIG. 2C and FIG. 2D, grooves 128b and 128c may include a plurality of strip-shaped grooves that are separated from each other, and the grooves 128b and 128c are arranged into a ring to surround the second conductive bumps 135. In more detail, in FIG. 2C, the multi-chip package structure 100b has four long-strip-shaped grooves 128b, respectively disposed at four corners of the second conductive bumps 135, so as to form a rectangle. In FIG. 2D, in the grooves 128c of the multi-chip package structure 100c, one portion appears to be long-strip-shaped while another portion appears to have an angle of bend. The long-strip-shaped grooves 128c are located at four sides of the second conductive bumps 135 and constitute four sides of a rectangle, and the grooves 128c having the angle of bend constitute four corners of the rectangle. Certainly, as long as the chance for the underfill 150 to overflow towards the first conductive bumps 130 can be reduced, the actual shapes of the grooves 128, 128a, 128b and 128c are limited to the ones described in the above.

Figure 3:
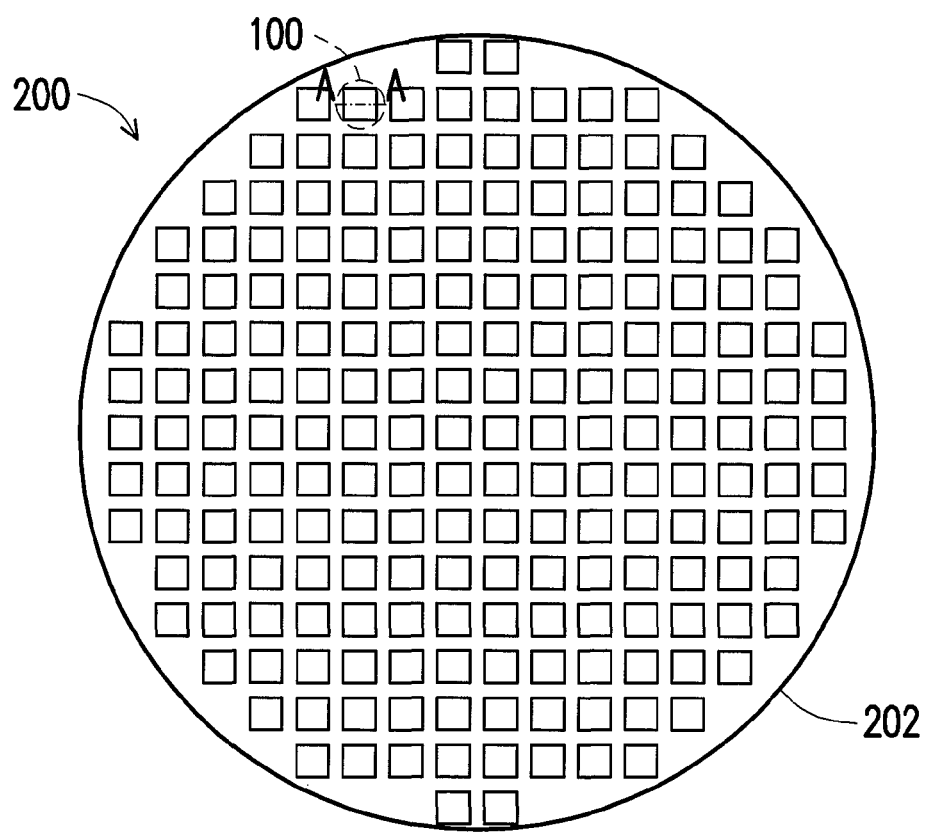
FIG. 3 is a schematic view illustrating a wafer level chip package structure according to an embodiment of the invention.

In the above embodiments, the grooves 128, 128a, 128b and 128c are manufactured during a Chip on Chip (COC) packaging stage, but in the other embodiments, the grooves 128, 128a, 128b and 128c may also be manufactured during a Chip on Wafer (COW) packaging stage. FIG. 3 is a schematic view illustrating a wafer level chip package structure according to an embodiment of the invention. Referring to FIG. 3, before a wafer 202 is cut, the circuit layer 120, the first conductive bumps 130, the second conductive bumps 135, the second chip 140, the circuit board 160 and so forth are disposed on the wafer 202, and the groove 128 is formed in the circuit layer 120 of the wafer 202 8, so as to form a wafer level chip package structure 200. The wafer level chip package structure 200 may be cut into a plurality of multi-chip package structures 100.

In below, using the wafer level chip package structure 200 of FIG. 3 as an example, a wafer level chip package manufacturing process of the wafer level chip package structure 200 will be explained. FIG. 4 to FIG. 12 are partial cross-sectional views schematically illustrating the manufacturing of the wafer level chip package structure according to an embodiment of the invention. FIG. 13 is a flow chart illustrating a wafer level chip package manufacturing process according to an embodiment of the invention. It is to be explained that, in order to clearly show the details regarding each element, FIG. 4 to FIG. 12 only illustrate partial regions of the wafer level chip package structure 200 during the manufacturing process. More precisely, FIG. 4 to FIG. 12 only illustrates the manufacturing process of one multi-chip package structure 100 in the wafer level chip package structure 200. Moreover, in order to facilitate understanding, an angle of perspective shown in FIG. 4 to FIG. 12 is illustrated with respect to the cross-sectional line A-A shown in FIG. 3. In addition, in the present embodiment, similar or identical elements are represented by same reference numerals as that of the elements in the previous embodiments.

A wafer level chip package manufacturing process 300 of the present embodiment includes the following steps: firstly, as depicted in step 310 of FIG. 13 and in FIG. 4 to FIG. 12, a wafer 202 is provided, and the wafer 202 includes a plurality of first chips 110 arranged in an array and a circuit layer disposed on the first chips 110, wherein each of the first chips 110 has a chip bonding region 112, a plurality of first inner pads 114 located in the chip bonding region 112 and a plurality of first outer pads 116 located outside of the chip bonding region 112. The circuit layer 120 includes a plurality of insulating layers (such as the first insulating layer 122 and the second insulating layer 126) and at least one metal layer 124 disposed between the first insulating layer 122 and the second insulating layer 126. The first insulating layer 122 and the second insulating layer 126 have at least one groove 128, the groove 128 is disposed between the first inner pads 114 and the first outer pads 116, and the groove 128 surrounds the first inner pads 114.

Figure 4:
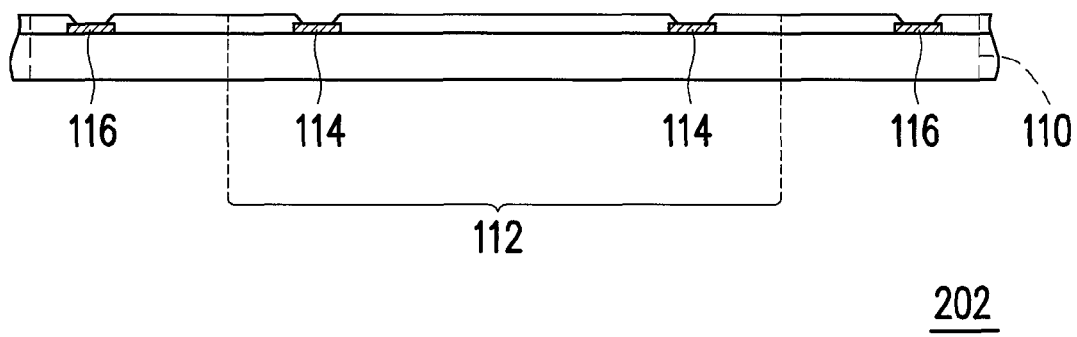
FIG. 4 to FIG. 12 are partial cross-sectional views schematically illustrating the manufacturing of the wafer level chip package structure according to an embodiment of the invention.

In detail, referring to FIG. 4, the wafer 202 includes a plurality of first chips 110, and each first chip 110 has a chip bonding region 112, a plurality of first inner pads 114 located in the chip bonding region 112 and a plurality of first outer pads 116 located outside of the chip bonding region 112. In the beginning, an incoming clean step may selectively be performed on the wafer 202, so as to remove dirt on a surface of the first chip 110 through using, for example, a high pressure water jet cleaning method. Certainly, in other embodiments, the wafer 202 may also selectively not being cleaned.

Figure 5:
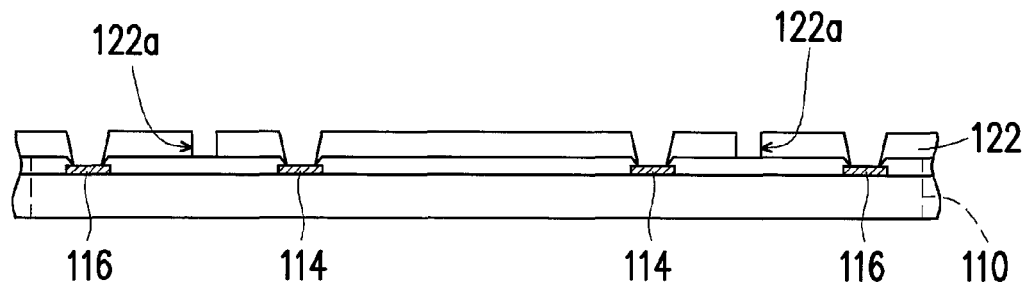

Next, as shown in FIG. 5, a first insulating layer 122 is formed on the first chip 110 by patterning. In detail, an insulating layer may firstly be coated on the first chip 110, wherein a material of the insulating layer may be a typical light-sensitive photoresist material, a polyimide (PI) layer or silicon nitride (Si3N4); then a mask (not shown) may be covered on the insulating layer; and an exposure procedure may be performed, wherein a pattern of the mask is corresponded to the pattern of the first chip that is to be exposed. Afterwards, a development procedure is performed by using a developer to dissolve and remove the unexposed insulating layer. Next, the unremoved insulating layer is cured by heating, and the cured insulating layer is performed with a surface treatment, for example, by means of oxygen plasma treatment, and thus the first insulating layer 122 is completed.

As show in FIG. 5, the first insulating layer 122 is disposed on the first chip 110, the first insulating layer 122 exposes the first inner pads 114 and the first outer pads 116, and the first insulating layer 122 has a concave trench 122a. The concave trench 122a is located at a position correspondingly between the first inner pads 114 and the first outer pads 116 and surrounds the first inner pads 114. In the present embodiment, a depth of the concave trench 122a is equal to a thickness of the first insulating layer 122, but in other embodiments, the depth of the concave trench may also be less than the thickness of the first insulating layer 122.

Figure 6:
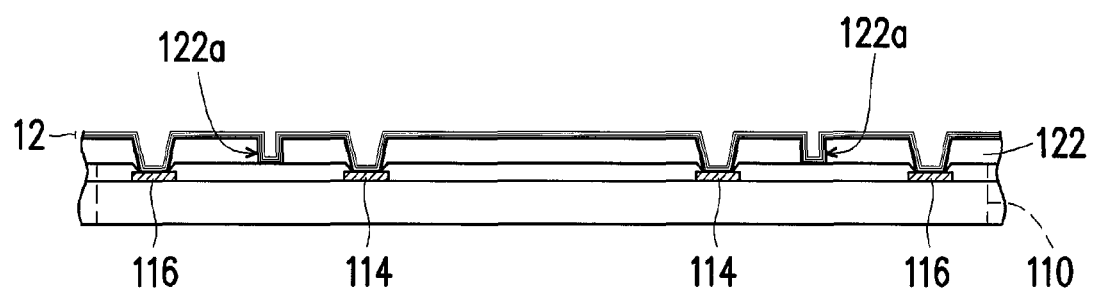

Furthermore, as shown in FIG. 6, a dielectric metal layer 12 is disposed using an UBM Deposition. In the present embodiment, firstly, argon gas is being used to remove oxides on the first insulating layer 122, the first inner pads 114 and the first outer pads 116. Next, a titanium-tungsten layer, a gold layer and a titanium layer are sequentially sputtered on the first insulating layer 122, the first inner pads 114 and the first outer pads 116 to form the dielectric metal layer 12, wherein the dielectric metal layer 12 may also be formed within the concave trench 122a of the first insulating layer 122.

Figure 7:
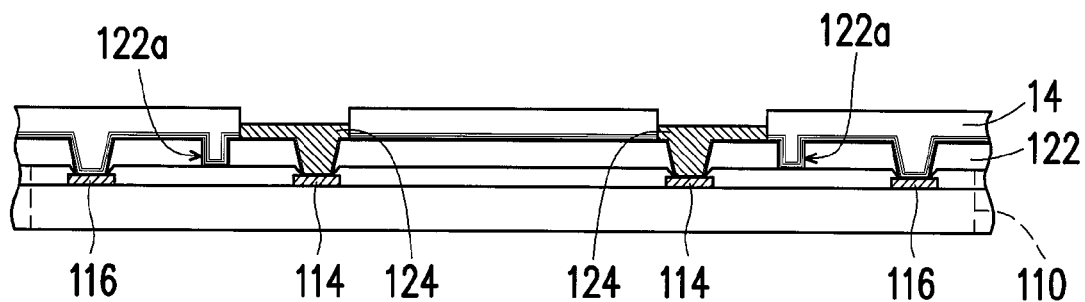
Figure 8:
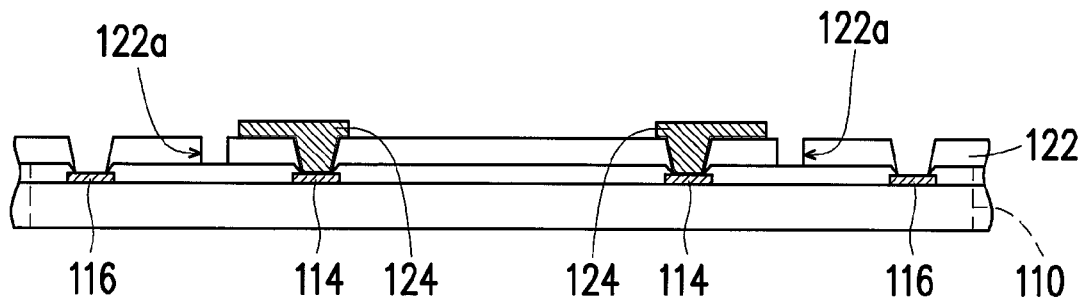

Next, as shown in FIG. 7, a photoresist layer 14 and a metal layer 124 are formed by patterning. In detail, in the present embodiment, a photoresist may firstly be coated on the dielectric metal layer 12 of FIG. 6 before performing an exposure procedure. An electroplating procedure is performed after an opening is formed in a region on the photoresist layer 14 corresponding to the first inner pads 114 and the first outer pads 116, and then the metal layer 124 is formed in the exposed opening. Next, the photoresist layer 14 and the dielectric metal layer 12 not covered by the metal layer 124 are removed, thereby remaining the metal layer 124. As shown in FIG. 8, the metal layer 124 may extend outwardly to form a redistribution circuit layer (RDL) disposed on the first insulating layer 122 and electrically connected with the first inner pads 114.

In other embodiments, the opening of the photoresist layer 14 may also be formed with an aperture of a smaller area in correspondence to the concave trench 122a of the first insulating layer 122, so that during the electroplating process, the original metal layer 124 that is extended outwardly in the opening may be shrunk into a columnar metal layer in correspondence to the first inner pads 114.

Figure 9:
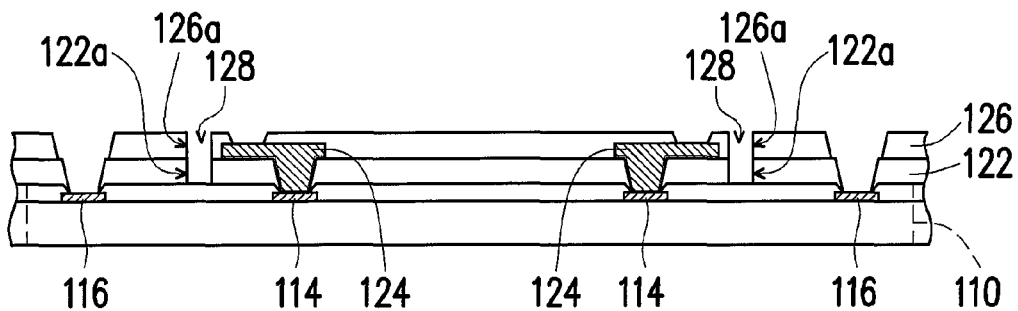

Thereafter, as shown in FIG. 9, a second insulating layer 126 is formed by patterning. In the present embodiment, a material of the second insulating layer 126 is, for example, polyimide; and as similar to the formation of the first insulating layer 122, the second insulating layer 126 is formed by the steps of exposure and development, etc. The second insulating layer 126 covers on the first insulating layer 122 and the metal layer 124, and exposes a portion of the metal layer 124 and the first outer pads 116. The second insulating layer 126 further has a perforated trench 126a, a location of the perforated trench 126a of the second insulating layer 126 is corresponded to the location of the concave trench 122a of the first insulating layer 122. In the present embodiment, the perforated trench 126a and the concave trench 122a together form the groove 128. A method for forming the groove 128 (namely, the method for forming the concave trench 122a of the first insulating layer 122 and the perforated trench 126a of the second insulating layer 126) includes yellow light process, laser processing or reactive ion etching (RIE).

In the present embodiment, the groove 128 is located in the first insulating layer 122 and the second insulating layer 126, the depth of the concave trench 122a of the first insulating layer 122 is equal to the thickness of the first insulating layer 122, and the depth of the perforated trench 126a of the second insulating layer 126 is equal to the thickness of the second insulating layer 126, so that the depth of the groove 128 is equal to the total thickness of the first insulating layer 122 and the second insulating layer 126. However, in other embodiments, the depth of the concave trench 122a of the first insulating layer 122 may also be less than the thickness of the first insulating layer 122, so that the depth of the groove 128 is less than the total thickness of the first insulating layer 122 and the second insulating layer 126. Otherwise, in other embodiments, the groove 128 may also only be located in the second insulating layer 126, such that the first insulating layer 122 does not have the concave trench 122a. The second insulating layer 126 may also only have an imperforated trench, rather than the perforated trench 126a.

Figure 10:
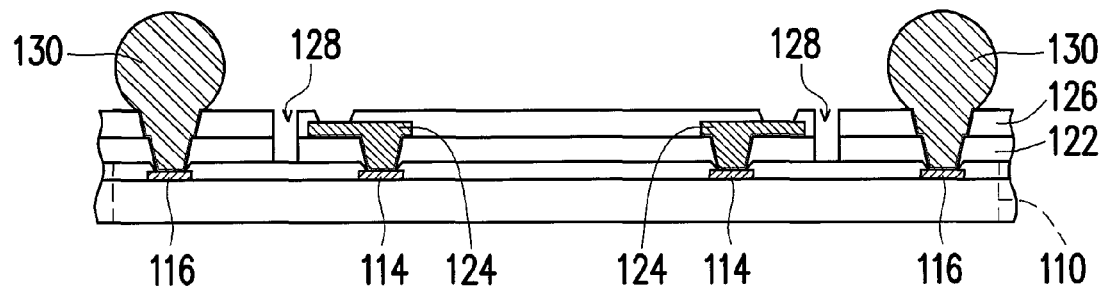

In the present embodiment, step 310 is completed by the procedures shown in FIG. 4 to FIG. 9. Furthermore, as shown in FIG. 10, a plurality of first conductive bumps 130 is formed on the first outer pads 116 (step 320) by means of bumping, electroplating, printing, etc, and afterwards, with heating reflow.

Figure 11:
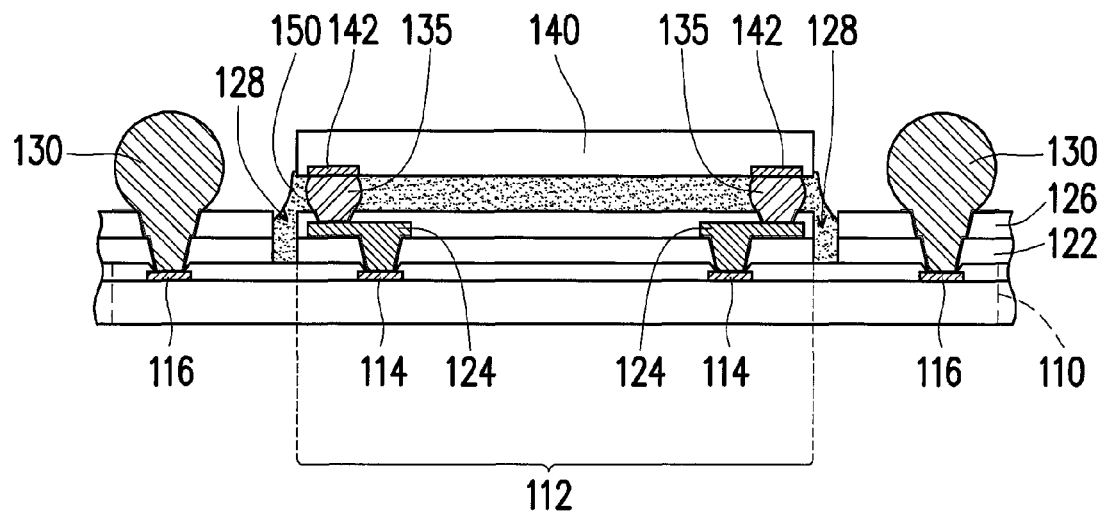

Next, as shown in FIG. 11, a second chip 140 is provided, the second chip 140 has a plurality of second pads 142, and a plurality of second conductive bumps 135 is formed on the second pads 142 (step 330). The material of the first conductive bumps 130 and the second conductive bumps 135 includes a metal element or an alloy, which may be a lead containing material (e.g., lead or tin-lead alloy) or a lead-free material, which includes gold, silver, copper, tin, nickel or an alloy thereof; in the present embodiment, the external shape of the first conductive bumps 130 and the second conductive bumps 135 is, for example, spherical; however, not only that the external shape can be spherical, cylindrical or dome-cylindrical, the material being used may also be formed by electroplating a single type of metal material or two types or more than two types of metal materials, such as to form a layer of tin (solder cap) on a copper pillar or to cover a layer of gold on the outer-wall of a copper bump and so forth, and the resulting bumps can all be feasible for the conductive bumps of the invention.

The second chip 140 is being flipped on the chip bonding region 112, so as to enable the second conductive bumps 135 to be located between the first inner pads 114 and the second pads 142, and to enable each of the first inner pads 114 to be electrically connected with the corresponding second pad 142 through the corresponding second conductive bump 135 (step 340), wherein the second conductive bumps 135 are electrically connected with the first inner pads 114 through the metal layer 124.

Next, an underfill 150 is formed between the first chip 110 and the second chip 140, so as to cover the second conductive bumps 135 (step 350).

Figure 12:
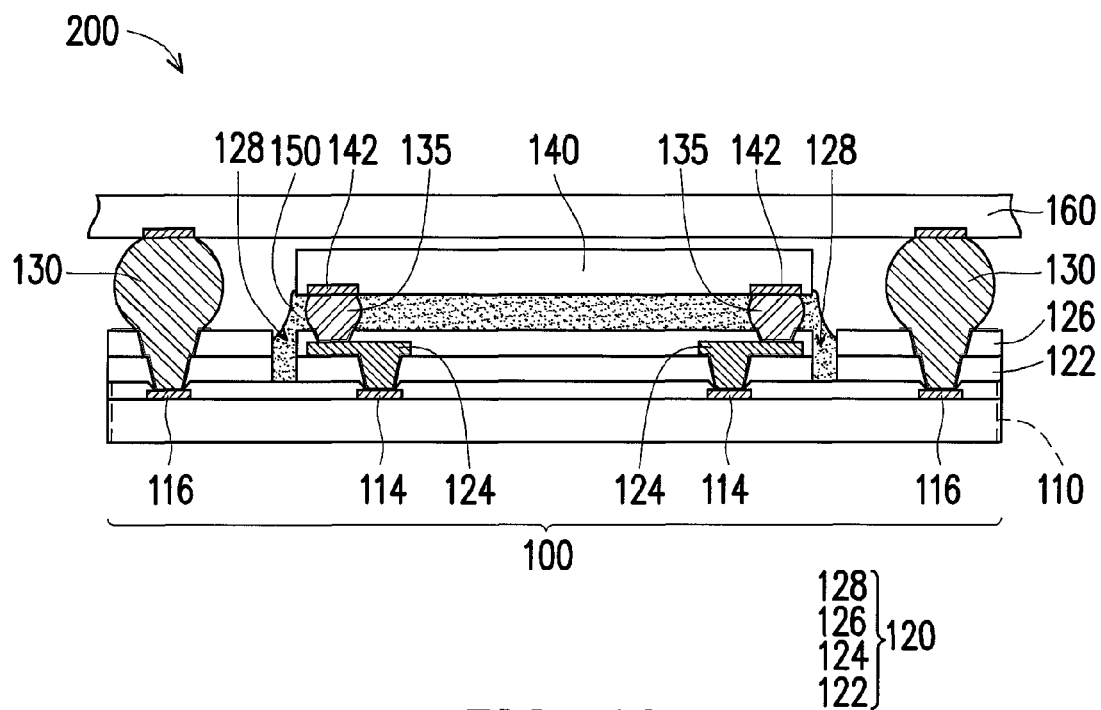
Figure 13:
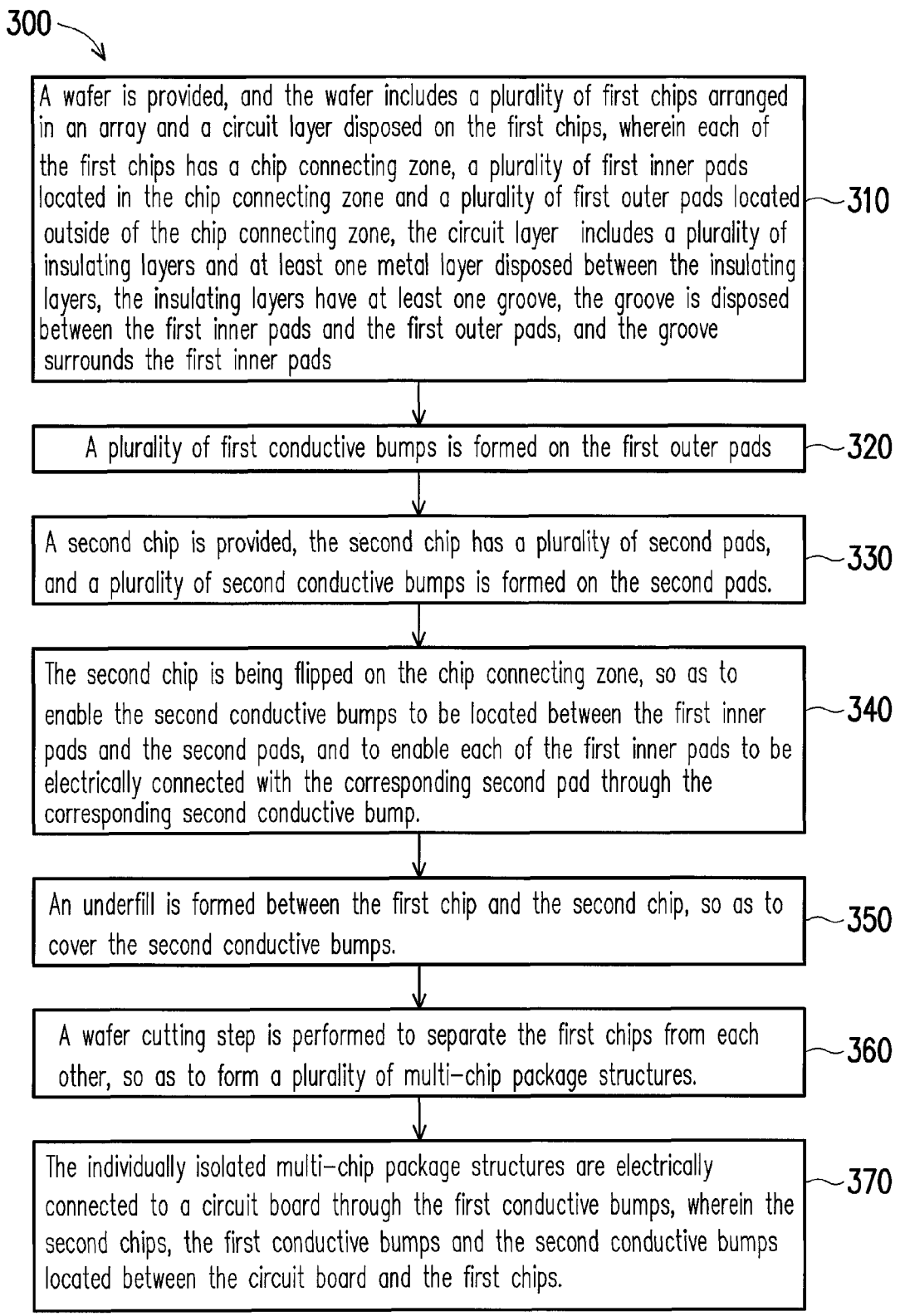
FIG. 13 is a flow chart illustrating a wafer level chip package manufacturing process according to an embodiment of the invention.

Finally, as shown in FIG. 12, a wafer cutting step is performed to separate the first chips 110 from each other, so as to form a plurality of multi-chip package structures 100 (step 360); and then, the individually isolated multi-chip package structures 100 are electrically connected to a circuit board 160 through the first conductive bumps 130, wherein the second chip 140, the first conductive bumps 130 and the second conductive bumps 135 located between the circuit board 160 and the first chips 110 (step 370). In the step 340 and the step 370 of the present embodiment, the second conductive bumps 135 may be connected to the metal layer 124 and the first conductive bumps 130 may be connected to the circuit board 160 through using a reflow operation. Noteworthily, the reflow operation may heat the first conductive bumps 130 and the second conductive bumps 135 by reflow at the same time, or may also firstly connect the second conductive bumps 135 onto the first chip 110 by reflow and then perform a second reflow operation to connect the first conductive bumps 130 onto the circuit board 160; in terms of implementation, the reflow operation may be adjusted according to different manufacturing processes.

It is to be explained again that, FIG. 4 to FIG. 12 only illustrate a portion of the wafer level chip package structure 200; and therefore, only one multi-chip package structure 100 is shown in FIG. 12, but indeed, if viewing from the perspective of FIG. 3, then a plurality of multi-chip package structures 100 as shown in FIG. 12 may be cut out.

In addition, although, in the present embodiment, the second chip 140 is flipped on the chip bonding region 112 (steps 330 and 340) after firstly forming the first conductive bumps 130 on the first outer pads 116 (step 320), in other embodiments, the second chip 140 may also be firstly flipped on the chip bonding region 112 to enable the second conductive bumps 135 to connected to the first inner pads 114 (step 330-340) before forming the first conductive bumps 130 on the first outer pads 116 (step 320), such that the order of steps in the manufacturing process may be adjusted according to the practical needs.

In summary, when experiencing an underfill overflow, the multi-chip package structure and the wafer level chip package structure of the invention prevent the excess underfill between the first chip and the second chip from contacting with the first conductive bumps and influencing the electrical connectivity between the first conductive bumps and the circuit board by forming at least one groove in the insulating layers and enabling the excess underfill to flow into the groove, wherein the groove is disposed between the first inner pads and the first outer pads and surrounds the first inner pads. The invention further provides the manufacturing process of said wafer level chip package structure, so as to produce a wafer level chip package structure that is capable of preventing the underfill from flowing to the first conductive bumps. Moreover, a plurality of said multi-chip package structures can be formed by performing a wafer cutting procedure on this wafer level chip package structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-chip package structure, comprising:
    a first chip, having a chip bonding region, a plurality of first inner pads located in the chip bonding region and a plurality of first outer pads located outside of the chip bonding region;
    a circuit layer, disposed on the first chip, the circuit layer comprising a plurality of insulating layers and at least one metal layer disposed between the insulating layers, the insulating layers having at least one groove, the groove disposed between the first inner pads and the first outer pads, and the groove surrounding the first inner pads;
    a plurality of first conductive bumps, disposed on the first outer pads;
    a second chip, flipped on the chip bonding region, and the second chip having a plurality of second pads;
    a plurality of second conductive bumps, located between the first inner pads and the second pads, and the first inner pads being electrically connected with the second pads through the second conductive bumps, respectively; and
    an underfill, located between the first chip and the second chip so as to cover the second conductive bumps, wherein the insulating layers of the circuit layer comprise:
        a first insulating layer, disposed on the first chip and exposing the first inner pads and the first outer pads; and
        a second insulating layer, covering on the first insulating layer, wherein the groove is located in the first insulating layer and the second insulating layer, a depth of the groove is less than or equal to a total thickness of the first insulating layer and the second insulating layer, and partial regions of the groove sink towards spaces between the first conductive bumps so that an outer profile of the groove appears as a profile staggered with straight lines and arcs.

2. The multi-chip package structure as recited in claim 1, wherein a size of the first chip is greater than a size of the second chip.

3. The multi-chip package structure as recited in claim 1, wherein the metal layer is disposed between the first insulating layer and the second insulating layer, the second insulating layer exposes a portion of the metal layer and the first outer pads, and the second conductive bumps are electrically connected with the first inner pads through the metal layer.

4. The multi-chip package structure as recited in claim 1, further comprising a circuit board, wherein the circuit board is electrically connected with the first conductive bumps, and the second chip, the first conductive bumps and the second conductive bumps are located between the circuit board and the first chip.

5. The multi-chip package structure as recited in claim 1, wherein a height of each of the first conductive bumps is greater than a height of each of the second conductive bumps.

6. The multi-chip package structure as recited in claim 1, wherein the groove comprises an annular groove, and the annular groove surrounds the first inner pads.

7. A wafer level chip package structure, comprising:
    a wafer, comprising a plurality of first chip arranged in an array and a circuit layer disposed on the first chips, wherein each of the first chips has a chip bonding region, a plurality of first inner pads located in the chip bonding region and a plurality of first outer pads located outside of the chip bonding region, the circuit layer comprises a plurality of insulating layers and at least one redistribution circuit layer disposed between the insulating layers, the insulating layers have a plurality of grooves, the grooves are disposed between the first inner pads and the first outer pads, and the grooves surround the first inner pads;

a plurality of first conductive bumps, disposed on the first outer pads;
a plurality of second chips, flipped on the chip bonding regions, and each of the second chips having a plurality of second pads;
a plurality of second conductive bumps, located between the first inner pads and the second pads, and the first inner pads being electrically connected with the second pads through the second conductive bumps, respectively; and
an underfill, located between the first chips and the second chips so as to cover the second conductive bumps, wherein the insulating layers of the circuit layer comprise:
a first insulating layer, disposed on the first chips and exposing the first inner pads and the first outer pads; and
a second insulating layer, covering on the first insulating layer, wherein the grooves are located in the first insulating layer and the second insulating layer, a depth of the grooves is less than or equal to a total thickness of the first insulating layer and the second insulating layer, and partial regions of each of the grooves sink towards spaces between the first conductive bumps so that an outer profile of each of the grooves appears as a profile staggered with straight lines and arcs.

8. The wafer level chip package structure as recited in claim 7, wherein a size of each of the first chips is greater than a size of each of the second chips.

9. The wafer level chip package structure as recited in claim 7, wherein the redistribution circuit layer is disposed between the first insulating layer and the second insulating layer, and the second insulating layer exposes a portion of the redistribution circuit layer and the first outer pads, wherein the second conductive bumps are electrically connected with the first inner pads through the redistribution circuit layer.

10. The wafer level chip package structure as recited in claim 7, wherein a height of each of the first conductive bumps is greater than a height of each of the second conductive bumps.

* * * * *